United States Patent [19]
Frisch et al.

[11] Patent Number: 5,144,159
[45] Date of Patent: Sep. 1, 1992

[54] POWER-ON-RESET (POR) CIRCUIT HAVING POWER SUPPLY RISE TIME INDEPENDENCE

[75] Inventors: Anthony E. Frisch; David W. Stringfellow, both of Kokomo, Ind.

[73] Assignee: Delco Electronics Corporation, Kokomo, Ind.

[21] Appl. No.: 617,713

[22] Filed: Nov. 26, 1990

[51] Int. Cl.$^5$ ............................................. G11C 11/00
[52] U.S. Cl. .................. 307/272.3; 307/591; 307/594; 307/451
[58] Field of Search ............. 307/272.3, 591, 594, 307/451

[56] References Cited

U.S. PATENT DOCUMENTS

| | | | |
|---|---|---|---|
| 3,895,239 | 7/1975 | Alaspa | 307/272.3 |
| 4,409,501 | 10/1983 | Eickerman et al. | 307/272.3 |
| 4,572,966 | 2/1986 | Hepworth | 307/272.3 |
| 4,634,905 | 1/1987 | Campbell, Jr. | 307/594 |
| 4,698,531 | 10/1987 | Jones | 307/594 |
| 4,788,454 | 11/1988 | Tanagawa et al. | 307/272.3 |
| 4,874,965 | 10/1989 | Campardo et al. | 307/272.3 |
| 4,885476 | 12/1989 | Mahabadi | 307/272.3 |
| 4,970,408 | 11/1990 | Hanke et al. | 307/272.3 |

Primary Examiner—Stanley D. Miller
Assistant Examiner—Scott A. Ouellette
Attorney, Agent, or Firm—Robert M. Sigler

[57] ABSTRACT

An output of a power-on-reset (POR) circuit is coupled to another circuit which needs to have the logic states thereof reset during each time a power supply used to power same is switched on. The POR circuit includes a first input circuit for generating an output signal that tracks the power supply output voltage Vdd approximately a first predetermined threshold below Vdd, as Vdd ramps up and further includes a second input circuit which generates an output signal which tracks approximately a second predetermined threshold above a second fixed voltage level, e.g., ground. The POR circuit further includes a comparator which compares the output signals from the first and second input circuits and switches an output signal thereof from a first to a second logic state once the input circuit output signals cross each other. A buffer is typically coupled to the output of the comparator to limit loading on same so as not to affect the comparator switching point.

19 Claims, 3 Drawing Sheets

POWER-ON-RESET (POR) CIRCUIT HAVING POWER SUPPLY RISE TIME INDEPENDENCE

FIELD OF THE INVENTION

The present invention relates to a power-on-reset circuit for resetting the logic states of other circuits when the power supply used with these other circuits is turned on, and, more particularly, to power-on-reset circuits which perform essentially independent of the rise time of the output voltage of the power supply when it is turned on.

BACKGROUND OF THE INVENTION

When a power supply is switched on a logic circuit being powered can initially be set to some random, non-functional logic order if the logic circuit has no power-on-reset circuit coupled thereto which controls initial conditions of the logic circuit. Therefore, a power-on-reset circuit is normally provided to set the logic to a preselected functional order.

FIG. 1 shows a prior art power-on-reset circuit 10 (with a dashed line rectangle) connected by a POR output terminal to a reset terminal 18 of an integrated circuit (IC) 19. Circuit 10 comprises a resistor 12, a capacitor 14 and an inverter 13. Inverter 13 is typically a Schmitt trigger. A first terminal of resistor 13 and first power supply terminals of the inverter 13 and the IC 19 are coupled to a first voltage source (power supply) Vdd and to a terminal 16. A second terminal of the resistor 12 is coupled to a first terminal of the capacitor 14, to an input of inverter 13, and to a terminal 15. A second terminal of the capacitor 14 and second power supply terminals of the inverter 13 and the IC 19 are connected to a second voltage source (power supply) Vss and to a terminal 17. In an illustrative embodiment Vss=0 volts (ground potential) and Vdd is switched from an off state of 0 volts to an on state of +5 volts.

FIG. 2 shows the voltage of Vdd (terminal 16) versus time with Vdd rising from 0 volts at time=t1 to +5 volts at time=t3. FIG. 3 shows the voltage of terminal 18 versus time as Vdd switches as is shown in FIG. 2. Prior to time=t1, the input and output of inverter 13 are both "0's" since it is assumed that there has been no power on for a period of time and all terminals have settled to 0 volts. For rise times of Vdd that are relatively short compared to the time constant of the resistance (R) of resistor 12 and the capacitance (C) of capacitor 14, inverter 13 is turned on as Vdd becomes positive enough to bias on inverter 13. As inverter 13 is being biased on and terminal 15 is still at or close to 0 volts, a "0" or low, the output of inverter 13 starts (at time=t2) to increase from 0 volts and reaches +5 volts, a "1" or high, by time=t4. As terminal 15 reaches +5 volts, a "1", inverter 13 changes output states and terminal 18 is set to a "0" (by time=t5). Thus circuit 10 functions to set reset terminal 18 of IC 19 to a "1'" which is then followed by a "0".

If the rise time of Vdd is relatively long compared to the R-C time constant of the resistor 12 and the capacitor 14, then inverter 13 begins to turn on as the voltage of terminal 15 rises and thus the output of inverter 13 can in some cases stay at a "0" and does not rise to the needed "1". This prevents IC 19 from being reset and thus can cause a failure in the proper operation of IC 19.

It is desirable to have a power-on-reset circuit which provides the needed sequence of logic levels independent of the rise time of a voltage source (power supply) used therewith.

SUMMARY OF THE INVENTION

The present invention is directed to a voltage dependent power-on-reset circuit which can be fabricated on an integrated circuit chip which contains another circuit which needs to be reset to preselected logic states upon power up. The power-on-reset circuit of the present invention acts independently of the rise time of a power supply used so it can reset the other circuit during power-up.

Viewed from one aspect, the present invention is directed to circuitry, which is coupled by an output terminal thereof to another circuit, for generating a power-on-reset signal to the other circuit, comprising first and second input circuits and a comparison means. The first input circuit comprises means responsive to a first voltage level including a predetermined first voltage from a power supply, for generating an output signal which tracks the first voltage level at a predetermined threshold below the instantaneous first voltage level. The second input circuit comprises means responsive to the instantaneous first voltage level from the power supply for generating an output signal which tracks the instantaneous first voltage level at a predetermined threshold above a second fixed voltage level of the power supply. The comparison means receives and compares the output signals from the first and second input circuits, and generates an output signal which changes from a first logic level to a second logic level to reset logic states of the other circuit once the voltage outputs from the first and second input circuits cross each other.

Viewed from another aspect, the present invention is directed to circuitry comprising a differential amplifier and first and second circuit branches. The differential amplifier has first and second input terminals and has an output terminal which is coupled to an output terminal of the circuitry. The first circuit branch comprises a first load element and a first diode with first terminals of the first load element and the first diode being coupled to the first input terminal of the differential amplifier. The second circuit branch comprises a second load element and a second diode with first terminals of the second load element and the first diode being coupled to the second input terminal of the differential amplifier.

The invention will be better understood from the following more detailed description taken with the accompanying drawings and claims.

The drawings are not necessarily to scale.

DETAILED DESCRIPTION

Figure 1:
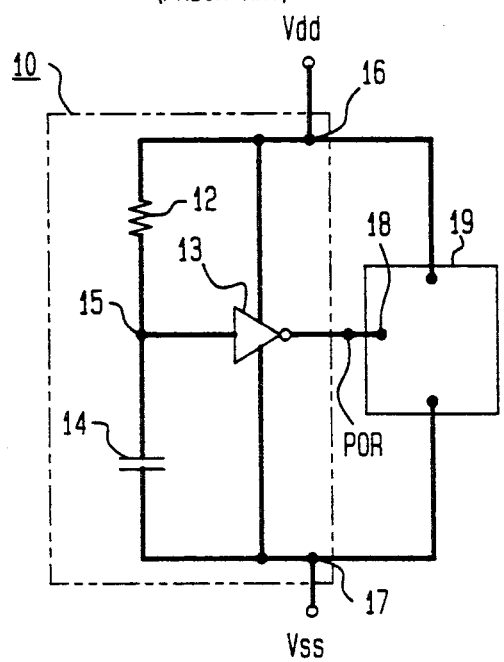
FIG. 1 is a diagram of a prior art power-on-reset circuit.
Figure 2:
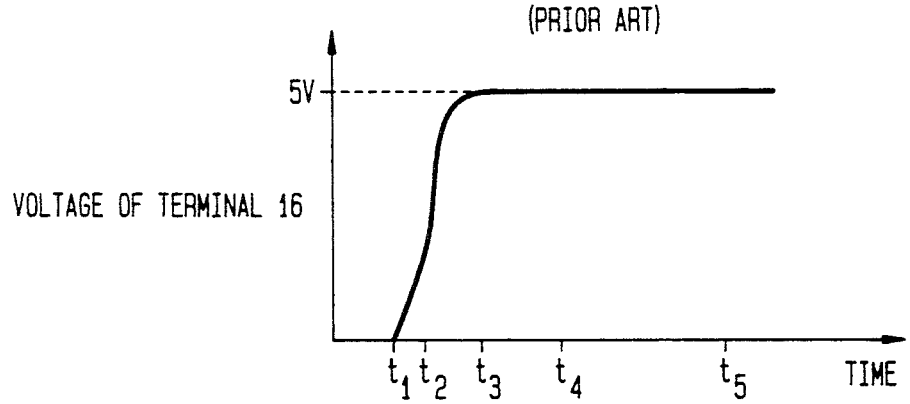
FIG. 2 is an exemplary graph of the voltage versus time of the voltage power supply Vdd of FIG. 1.
Figure 3:
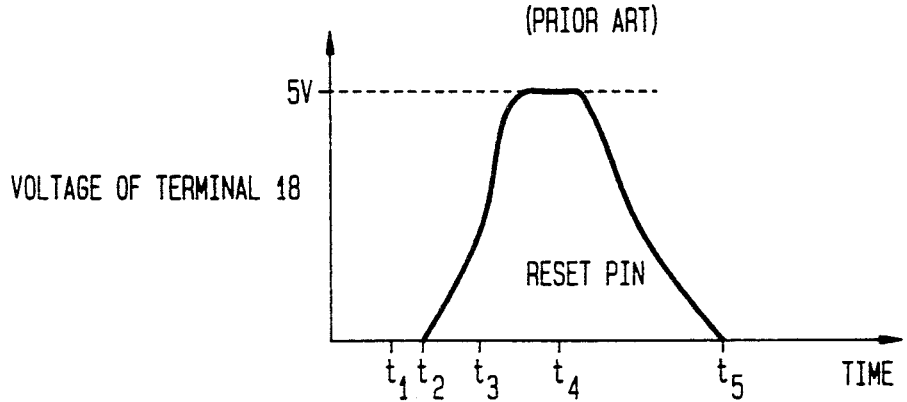
FIG. 3 is an exemplary graph of voltage versus time at the output of the circuit of FIG. 1.
Figure 4:
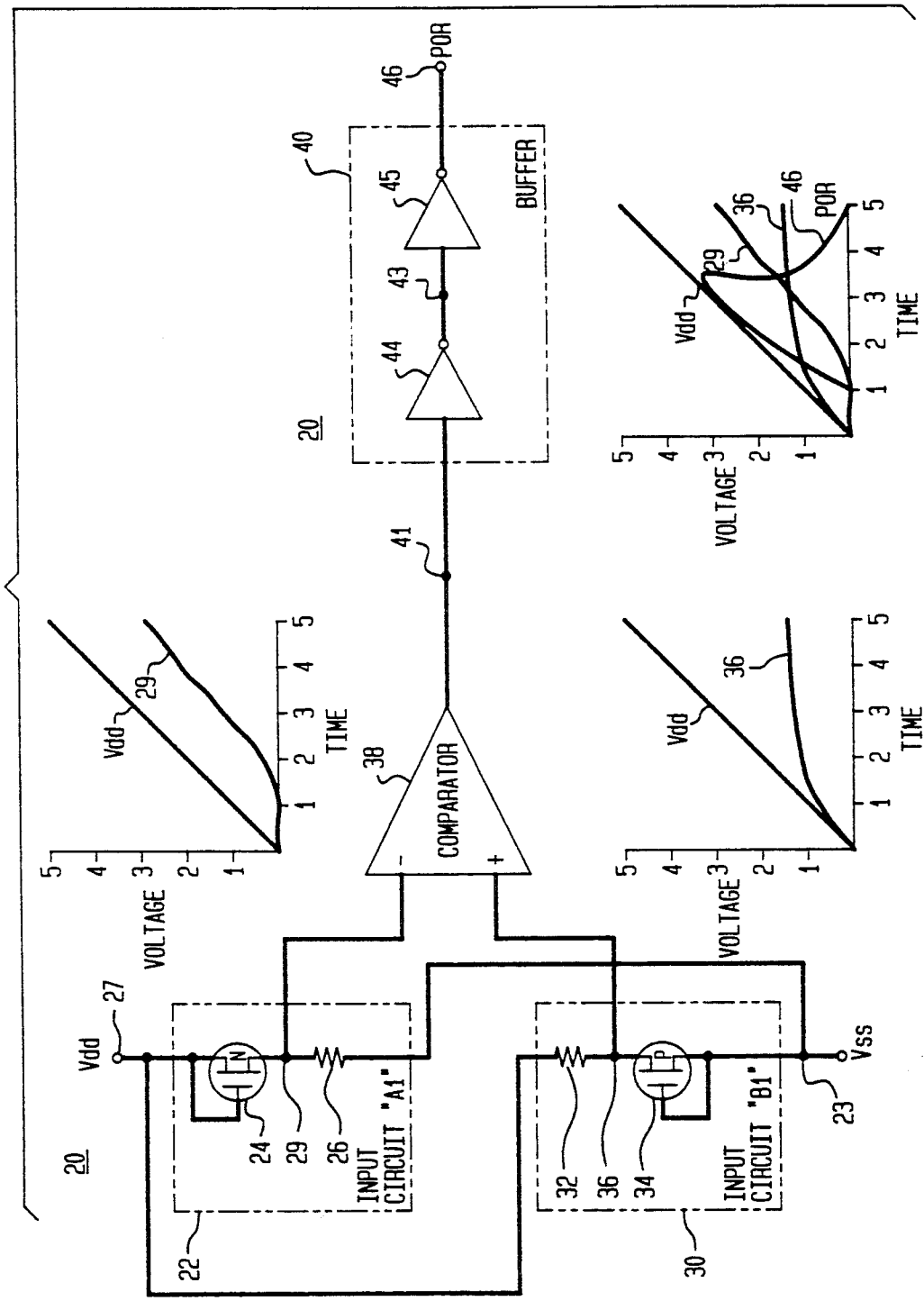
FIG. 4 is circuit diagram of a power-on-reset circuit in accordance with the present invention and includes graphs of voltage versus time for various terminals of the inventive circuit.

Referring now to FIG. 4, there is shown a power-on-reset (POR) circuit 20 in accordance with the present invention. Circuit 20 comprises an input circuit "A1" 22, (shown within a dashed line rectangle), an input circuit "B1" 30 (shown within a dashed line rectangle), a comparator 38, and a buffer 40 (shown within a dashed line rectangle). Input circuit "A1" 22 comprises an n-channel field effect transistor (FET) 24 and a resistor 26 and may be denoted as a first branch circuit. Input circuit "B1" 30 comprises a resistor 32 and a p-channel FET 34 and may be denoted as a second branch circuit. Each of FETs 24 and 34 has a gate, a source and a drain. The comparator 38 has a negative input terminal, a positive input terminal and an output terminal and may be denoted as a differential amplifier and/or as comparison means. The buffer 40 comprises first and second inverters 44 and 45. Circuit 20 functions essentially independent of the rise time of a voltage source (power supply) Vdd used with same and therefore the sequence of output signal levels at a POR output terminal 46 thereof is essentially the same independent of the rise time of Vdd.

The gate and drain of FET 24 and a first terminal of the resistor 32 are coupled to a terminal 27 and to Vdd. First voltage supply terminals (not shown) of comparator 38 and inverters 44 and 46 are typically coupled to Vdd. A first terminal of the resistor 26 and the gate and drain of FET 34 are coupled to a second power supply (voltage source) Vss and to a terminal 23. Second voltage supply terminals (not shown) of the comparator 38 and the inverters 44 and 36 are typically coupled to Vss. FETs 24 and 34 function essentially as diodes. The source of FET 24 is coupled to a second terminal of the resistor 26, to the negative input of comparator 38 and to a terminal 29. A second terminal of the resistor 32 is coupled to the drain of FET 34, to the positive input of comparator 38 and to a terminal 36. The output of comparator 38 is coupled to an input of inverter 44 and to a terminal 41. An output of inverter 44 is coupled to an input of inverter 45 and to a terminal 43. An output of inverter 45 is coupled to the POR output terminal 46.

It is to be understood that buffer 40 functions to limit loading on the output of comparator 38 and in some cases is optional.

In operation, as Vdd is ramped from an exemplary 0 volts to +5 volts, terminal 29 of input circuit "A1" 22 rises as shown in the graphs of voltage versus time which are shown adjacent the input circuit "A1" 22 and below the buffer 40. More particularly, terminal 29 rises in potential (voltage) and tracks about one n-channel threshold voltage below the value of Vdd after FET 24 turns on. Similarly, terminal 36 of input circuit "B1" 30 rises in potential as shown in the graphs of voltage versus time which are shown adjacent the input circuit "B1" 30 and below the buffer 40 as Vdd is ramped between 0 to +5 volts. The voltage of terminal 36 tracks about one p-channel threshold voltage (e.g., 0.7 volts) above the value of Vss after FET 34 turns on. As is shown in the graph of voltage versus time below buffer 40, the voltages at terminals 29 and 36 overlap and cross when Vdd is at a value of, for example, about 3 volts. This cross-over point is approximately half-supply based on the relative thresholds of the n-channel (FET 24) and p-channel (FET 34) transistors. It is to be understood that the resistors 26 and 32 are each used as a high impedance load as seen from the drain of the transistors 24 and 34, respectively. These resistors provide a current path to the voltage supply (power supply) terminals 27 and 23 through the FETs 24 and 34. Comparator 38 monitors when the voltage signals from terminals 29 and 36 cross. When this occurs terminal 41 (the output of comparator 38) is switched from a logic high, a "1", to a logic low, a "0". The voltage of terminal 41 starts to increase as soon as comparator 38 is biased on (at about a Vdd voltage of +1.5 volts) and starts to track Vdd as is shown in the curve below buffer 40. As soon as the voltage of terminal 36 exceeds the voltage of terminal 29, comparator 38 switches states and the voltage at the output thereof (terminal 41) starts to decrease towards Vss (0 volts). The signals at terminal 41, after buffering and a delay (typically of just a few nanoseconds) introduced by buffer circuit 40, are then delivered to POR output terminal 46. For fast rise times of Vdd, the output terminal 46 can reach the high level (e.g., +5.0 volts) of Vdd before it then drops to Vss (e.g., 0 volts). A circuit (not shown) needing a Power-On-Reset Circuit 20 is coupled by a power-on-reset input terminal to the POR output terminal 46.

An IC fabricated in a typical Complementary-Metal-Oxide-Semiconductor (CMOS) process can function above a voltage value of, for example, +2 volts. The POR output terminal 46 of circuit 20 resets the IC if terminal 46 is held in a "high" logic state above the exemplary +2 volts. The IC is allowed to come out of reset above, for example, +3 volts, so it can function in a proper manner. Logic circuits using a CMOS process and operating with a +5 volt voltage source Vdd typically are required to operate in the range from +4.5 volts to +5.5 volts. The circuit 20 is designed to reset the IC when the Vdd supply terminal 27 voltage is ramping up at a slow rate (e.g., about 50 milliseconds or greater), at a fast rate (e.g., about 500 microseconds or less) or at any rate in between. Such circuit is designed to not reset the IC as the Vdd supply voltage is ramping down. Therefore, the reset signal does not appear until the IC voltage drops below, for example, 0.5 volts when Vdd is ramping down.

Figure 5:
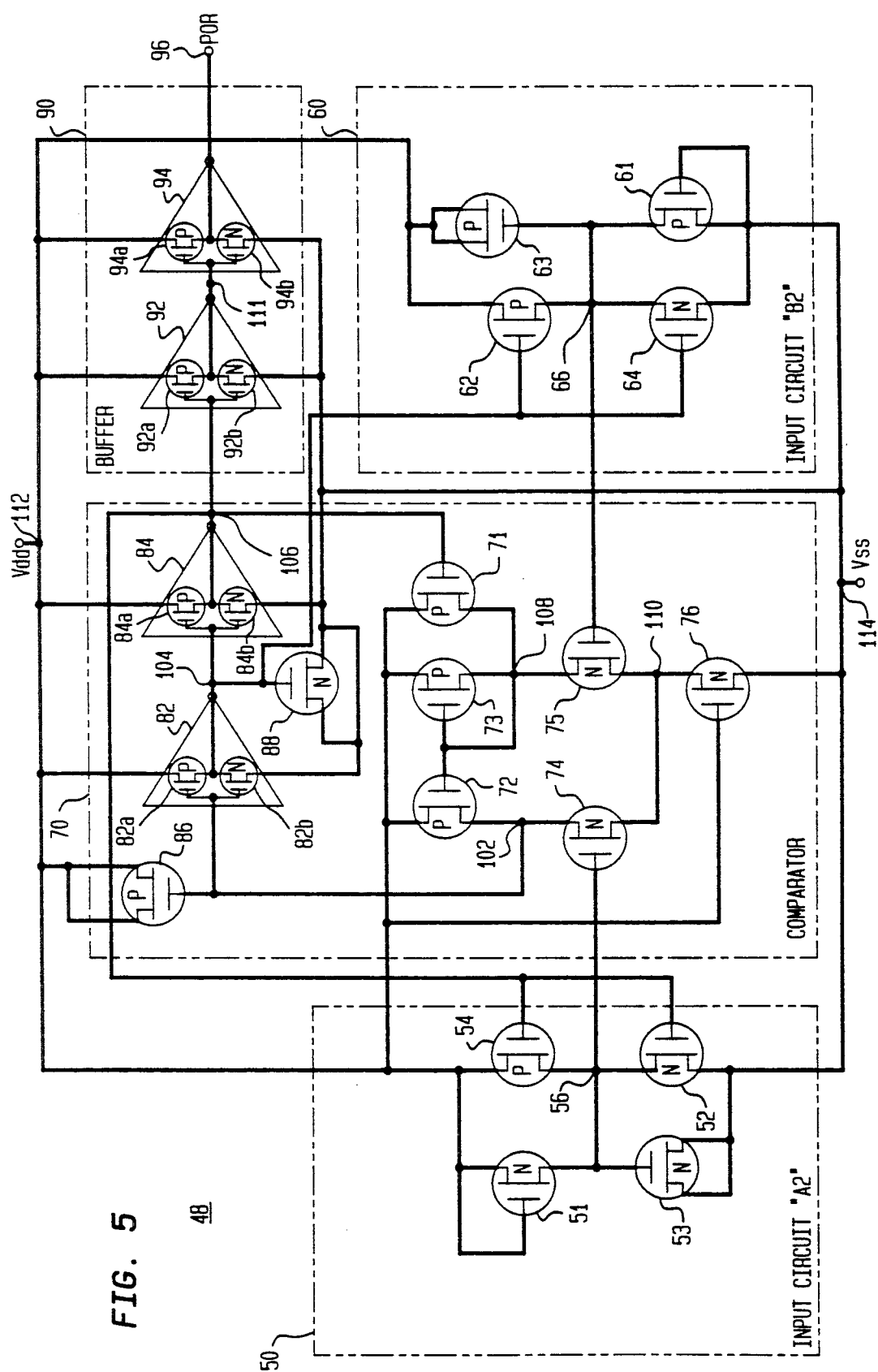
FIG. 5 is a circuit diagram of preferred power-on-reset circuit in accordance with the present invention.

Referring now to FIG. 5, there is shown a power-on-reset circuit 48 in accordance with a preferred embodiment of the present invention. Circuit 48 comprises an input circuit "A2" 50 (shown within a dashed line rectangle), an input circuit "B2" 60 (shown within a dashed line rectangle), a comparator 70 (shown within a dashed line rectangle), and an buffer 90 (shown within a dashed line rectangle). Circuit 48 is similar to circuit 20 of FIG. 4 and functions in a very similar manner with input circuit "A2", input circuit "B2", comparator 70 and buffer 90 corresponding to input circuit "A1" 22, input circuit "B1" 30, comparator 38 and buffer 40, respectively, of circuit 20 of FIG. 4. Input circuit "A2" 50 comprises n-channel field effect transistors (FETs) 51, 52 and 53 and a p-channel FET 54. Input circuit "B2" comprises p-channel FETs 61, 61 and 63 and an n-channel FET 64. Comparator 70 comprises p-channel FETs 71, 72, 73 and 86, n-channel FETs 74, 75, 76 and 88, and inverters 82 and 84. Buffer 90 comprises inverters 92 and 94. Inverter 82 comprises a p-channel FET 82$a$ and an n-channel FET 82$b$; inverter 84 comprises a p-channel FET 84$a$ and an n-channel FET 84$b$; inverter 92 comprises a p-channel FET 92$a$ and an n-channel FET 92$b$; and inverter 94 comprises a p-channel FET 94$a$ and an n-channel FET 94$b$. In some applications buffer 90 is optional.

FETs 53, 63, 86 and 88 each have the respective drain and source coupled to a common terminal and, as such, each functions essentially as a capacitor and may be denoted as a capacitor means. Transistors 51 and 61 each have the drain and gate thereof coupled together and each functions essentially as a diode. Transistor 73 acts to set the voltage of terminal 108 and acts as a load element for the comparator 70.

A first power supply terminal Vdd is coupled to the drain and gate of FET 51, to the sources of FETs 54, 62, 71, 72, 73, 82a, 84a, 92a and 94a, to the source and drain of FETs 63 and 86, to the gate of FET 76, and to a terminal 112. A second power supply terminal Vss is coupled to the drain and source of FETs 53 and 88, to the sources of FETs 52, 64, 76, 82b, 84b, 92b, and 94b, to the gate and drain of FET 61, and to a terminal 114. Typically Vdd is switched from 0 volts to a positive level which is illustratively +5 volts in a period of time determined by the rise time of the Vdd power supply which typically has its output signal smoothed using filter capacitors (not shown). Vss is illustratively ground potential (0 volts) and is maintained at such level.

The drain of FET 51 is coupled to the gates of FETs 53, and 74, to the drains of FETs 52 and 54, and to a terminal 56. The gates of FETs 52 and 54 are coupled to an output of inverter 84, to an input of inverter 92, to the gate of FET 71 and to a terminal 106.

The gates of FETs 63 and 75 are coupled to the drains of FETs 62 and 64, to the source of FET 61 and to a terminal 66. The gates of FETs 62 and 64 are coupled to the gate of FET 88, to an output of inverter 82, to an input of inverter 84 and to a terminal 104.

The source of FETs 74 and 75 are coupled to the drain of transistor 76 and to a terminal 110. FETs 74 and 75 form a common source type differential amplifier with FET 76 serving as a current sink. The drains of FETs 72 and 74 are coupled to the gate of FET 86, to an input of inverter 82 and to a terminal 102. The gates of FETs 72 and 73 are coupled to the drains of FETs 71, 73 and 75 and to a terminal 108.

The drains of FETs 82a and 82b are coupled to the gates of FETs 84a and 84b, to an output of inverter 82, to an input of inverter 84, and to the terminal 104. The drains of FETs 84a and 84b are coupled to the gates of FETs 92a and 92b, to an output of inverter 84, to an input of inverter 92, to the gates of FETs 52, 54 and 71 and to the terminal 106. The drains of FETs 92a and 92b are coupled to the gates of FETs 94a and 94b, to an output of inverter 92, to an input of inverter 94, and to a terminal 111. The drains of FETs 94a and 94b are coupled to an output of inverter 94, and to a POR output terminal 96 of the circuit 48.

Circuit 48 functions such that essentially independent of the rise time associated with a ramping of Vdd from 0 volts to +5 volts, the POR output terminal 96 is first set to a logical high level, a "1", for a useful period of time, and then thereafter is set to a low logic level, a "0".

The operation of circuit 48 is as follows: It is assumed that Vdd is at 0 volts and that Vdd has been at 0 volts for a long enough time such that all terminals of circuit 48 are at 0 volts. Vdd is then ramped from 0 volts to +5 volts. This change in voltage of Vdd is coupled through FET 86 (which acts as a capacitor) to the input of inverter 82 and to terminal 102. In addition, inverters 82, 84, 92 and 94 are biased on and function when Vdd is about 1.5 volts or greater. Accordingly, the voltage AC coupled to terminal 102 through FET 86 results in a low output signal, a "0", at the output of (terminal 104) inverter 82. This results in a high output signal, a "1", at the output (terminal 106) of inverter 84 which in turn results in a "0" at the output (terminal 111) of inverter 92 which in turn results in a "1" at the POR output terminal 96. This "1" on output terminal 96 facilitates a resetting of logic levels of another circuit (not shown) coupled to output terminal 96. Transistor 88, which acts as a capacitor, holds the "0" signal at terminal 104 for a useful time period such that a "1" exists at POR output terminal 96 for a time which is long enough to reset logic levels of an integrated circuit (not shown) or other circuit (not shown) coupled to POR output terminal 96.

As Vdd rises from 0 volts to +5 volts, input circuit "A2" 50, input circuit "B2" 60 and the comparator 70 become activated when Vdd reaches about 1-1.5 volts. With respect to input circuit "A2" 50, FET 52 becomes biased on (enabled) and FET 54 becomes biased off (disabled) by the "1" on terminal 106. As Vdd increases in voltage such that it is above the threshold voltage of FET 51, FET 51 is enabled and conduction from Vdd through FETs 51 and 52 begins. This causes the voltage of terminal 56 to track exactly one threshold voltage below the instantaneous value of Vdd as Vdd rises, until Vdd reaches the exemplary +5 volts. After Vdd reaches +5 volts, terminal 56 remains at about +4.3 volts, until input circuit "A2" 50 is switched off, as is described later herein. FET 52 is typically a small geometry transistor (sometimes denoted as a "weak" transistor) and acts essentially as a resistor. FET 53, which acts as a capacitor, tends to slow the rise in the voltage of terminal 56. Similarly, input circuit "B2" 60 is being activated with FET 62 being enabled and FET 64 being disabled. FET 62 is typically a small geometry transistor (sometimes denoted as a "weak" transistor) and acts essentially as a resistor. FET 63, which acts as a capacitor, serves to quickly AC couple the change in voltage of Vdd at terminal 112 to terminal 66. In addition, FET 61 is enabled and a current path between Vdd and Vss is established through FETs 62 and 61. Resulting current flow through FETs 62 and 61 causes the voltage of terminal 66 to quickly increase from 0 volts to the threshold voltage (0.7 volts) of FET 61 above Vss (0 volts). It is thus clear that as Vdd increases from 0 volts to +5 volts, that after a delay associated with FET 51 not being enabled until the voltage of Vdd is at least equal to the threshold voltage of FET 51 and the delay introduced by the capacitance of FET 53, that the voltage at terminal 56, (which is considered to be a negative input of comparator 70) begins to increase to within about one threshold value below Vdd. Correspondingly, the voltage at terminal 66 (which is considered to be a positive input of comparator 70) quickly moves from 0 volts up to the threshold voltage of FET 61 and then tracks about one threshold voltage above Vss.

FET 72 serves as an active load element for FET 74, and FET 73 serves as an active load element for FET 75. As Vdd goes from 0 volts to +5 volts, FET 76 is enabled and acts as a constant current sink which pulls current from a first circuit leg comprising FETs 72 and 74 or from a second circuit leg comprising FETs 73 and 75. Whichever of the FETs 74 or 75 has the more positive voltage on the gate thereof receives the current flow through FET 76. Since initially when Vdd goes from 0 volts to +5 volts, the gate (terminal 66) of FET 75 is more positive than the gate (terminal 56) of FET 74, current flows from Vdd through FETs 73, 75 and 76 into Vss. At this time the gate of FET 71 is at a "1" and thus FET 71 is disabled. The current flow through FETs 73, 75 and 76 sets up a voltage at terminal 108 which enables FETs 72 and 73. Since FET 74 is disabled at this time, terminal 102 is pulled up in voltage by enabled FET 72 to Vdd and is held there. Initially terminal 102 was AC coupled to Vdd by the capacitive action of FET 86. It is now actively held at such voltage by enabled FET 72. Accordingly, the POR output terminal 96 continues to be held at a "1" since terminal 102 is a "1".

After terminal 66 reaches the theshold voltage of FET 61 above Vss, terminal 56 reaches and then exceeds this value as it moves toward Vdd minus the threshold voltage of FET 51. This results in the voltage of the gate of FET 74 increasing to a more positive value than the voltage of the gate of FET 75. Current flow now switches from FETs 73, 75 and 76 to FETs 72, 74 and 76. FETs 74 and 76 have geometries relative to the geometry of FET 72 such that their resistances are low compared to the resistance of FET 72. Accordingly, terminal 102 is close to Vss, (0 volts), a "0". This change in the voltage at the input of inverter 82 causes the output thereof to switch to a "1" which subsequently results in the output (terminal 106) of inverter 84 being switched to a "0". This in turn results in the POR output terminal 96 being switched to a "0". This "0" output signal which follows the "1" output signal allows an IC (not shown) coupled to POR output terminal 96 to function normally after being reset by the previous output "1".

The "0" now on terminal 106 enables FET 71 which pulls up the voltage of terminal 108 to Vdd. This diables FETs 72 and 73. Since FET 75 is disabled at this time, there is no path from Vdd to terminal 110 and therefore no current flows through FET 76. The "0" on terminal 106 also enables FET 54 and disables FET 52. This opens any DC electrical path between Vdd and Vss through FETs 51, and 52 and thus powers down input circuit "A2" 50. In addition, enabled FET 54 pulls terminal 56 to Vdd. The "1" on terminal 104 disables FET 62 and enables FET 64. This breaks all DC electrical paths between Vdd and Vss between FETs 61, and 62 and thus powers down input circuit "B2" 60. Enabled FET 64 actively pulls down the voltage of terminal 66 to Vss. During this time only inverters 82, 84, 92 and 94 are functioning but draw no DC current since they are CMOS type inverters. Accordingly, after the "1" on output terminal 96 becomes a "0", circuit 48 ceases to draw current from Vdd and thus ceases to dissipate power.

An embodiment of circuit 48 was fabricated in a 22,500 square micron area of silicon using complementary metal oxide silicon (CMOS) technology and was found to be functional. Circuit 48 was fabricated on an integrated circuit chip which contained CMOS circuitry which was coupled to circuit 48. In this embodiment Vdd was pulsed from 0 to +5 volts with a rise time (the time for Vdd to go from 0.5 volts to 4.5 volts) varying in a range of 40 nanoseconds (ns) to 2 milliseconds (ms), Vss was held at 0 volts, all the FETs were insulated gate field effect transistors (IGFETs), and the IGFETs had the following length(microns)/width(microns) ratios: IGFET 51—8/8, IGFET 52—5/50, IGFET 53—20/20, IGFET 54—5/60, IGFET 61—10/5, IGFET 62—5/50, IGFET 63—15/15, IGFET 64—5/50, IGFET 71—5/5, IGFET 72—10/5, IGFET 73—10/5, IGFET 74—5/5, IGFET 75—5/5, IGFET 76—5/50, IGFET 82a—5/15, IGFET 82b—5/5, IGFET 84a—15/5, IGFET 84b—5/5, IGFET 86—10/20, IGFET 88—20/10, IGFET 92a—12/3, IGFET 92b—4/3, IGFET 94a—30/3, and IGFET 94b—10/3. The ratios of length to width are drawn dimensions which were then optically shrunk by ten (10%). It is to be noted that in inverter 82 that FET 82b is a "strong" transistor (i.e., its length/width ratio results in relatively low resistance between the drain and source when it is enabled) and FET 82a is a "weak" transistor (i.e., its length/width ratio results in a relatively high resistance when it is enabled). Choosing these design characteristics biases inverter 82 to be set to a level at or near Vss which is a "low" or a "0". Conversely, in inverter 84, FET 84a is a "strong" transistor and transistor 84b is a "weak" transistor. Choosing these design characteristics biases inverter 84 to be set to a level at or near Vdd which is a "high" or a "1". The design of inverters 82 and 84 facilitates a "0" on terminal 104 and a "1" on terminal 106 soon after the beginning the operation of circuit 48 as soon a Vdd reaches about +2 volts. These voltage levels on terminals 104 and 106 allow input circuits "A2" 50 and "B2" 60 to begin to function because they enable FETs 52 and 62 while disabling FETs 54 and 64.

It is to be noted that if Vdd has a fast rise time (e.g., less than about 500 microseconds), then FET capacitors FET 86 and 63 quickly couple the rapid change in voltage of Vdd to terminals 102 and 66, respectively. This causes terminal 102 to rapidly be pulled up from the initial 0 volts, a "0", to the level of Vdd, a "1". As Vdd reaches about +2 volts, inverters 82, 84, 92 and 94 begin to operate and the output terminal 96 of circuit 48 is pulled to a "1" as is desired. Input circuit "B2" 60 rapidly pulls the voltage of terminal 66 positive such that it becomes more positive that the voltage of terminal 56. This causes current flow through FETs 73, 75 and 76 which causes terminal 102, which was previously coupled through FET 86 to Vdd and follows Vdd as Vdd rises in voltage, to be actively held at the level of Vdd, a "1". Soon thereafter terminal 56 becomes more positive than terminal 66 and current flow in the differential amplifier switches from FETs 73, 75 and 76 to FETs 72, 74 and 76. Since FETs 74 and 76 are designed to have lower resistances than that of FET 72, terminal 102 is held at a level close to Vss which is a "0". The "0" on terminal 102 results in terminal 96 being switched to a "0".

If the rise time of Vdd is relatively slow (e.g., about 50 milliseconds or greater), then FET capacitors 86 and 63 play a small role and the voltages of terminals 102 and 66 are relatively slowly increased in voltage as a result of AC coupling through the respective capacitors. The initial "0" on terminal 104 tends to be held by the Vss voltage level on FET capacitor 88 and the "strong" n-channel FET 82b of inverter 82, while terminal 106 tends to quickly switch from the initial "0" to a "1". The "1" on terminal 106 causes output terminal 96 to be switched to a "1". Terminal 102 is set to Vdd when the differential amplifier comprising FETs 74 and 75 is initially turned on as the voltage of terminal 66 rises faster than the voltage of terminal 56. As the voltage of terminal 56 becomes more positive than the voltage of terminal 66, the voltage of terminal 102 is pulled to a "0" by FETs 74 and 76. This results in output terminal 96 being switched to a "0". It is thus clear that independent of the rise time of Vdd, that the circuit 48 functions to first set output terminal 96 to a "1" and then to switch it to a "0".

It is to be understood that the specific embodiments described herein are intended merely to be illustrative of the spirit and scope of the present invention. Modifications can readily be made by those skilled in the art consistent with the principles of this invention. For example, the Vdd and Vss voltage levels can comprise any suitable voltage levels other than +5 volts and 0 volts. Still further, the power-on-reset circuits can be fabricated using bipolar technology instead of CMOS technology. The FET diodes could be replaced with conventional p-n diodes and the FETs could be replaced by bipolar transistors. Still further, the FETs that function essentially as resistive load elements could be replaced by resistors. One basic power-on-reset circuit could be fabricated using n-p-n transistors, p-n diodes and resistors. The p-n diodes could be n-p-n transistors with the collector and base of each transistor coupled together. Each of the input circuits would be the series combination of a resistor and a p-n diode. The comparator could be a pair of emitter coupled n-p-n transistors each having a separate resistor load element coupled to the collector thereof and having the emitters thereof coupled to the collector of a third n-p-n transistor whose emitter has a resistor coupled thereto.

What is claimed is:

1. Circuitry comprising:
   a differential amplifier having first and second input terminals and having an output terminal which is coupled to an output terminal of the circuitry;
   a first circuit branch having a first load element and a first diode, a first terminal of the first load element being coupled to a first terminal of the first diode and to the first input terminal of the differential amplifier and a second terminal of the first diode being coupled to a first power supply terminal of the circuitry in a forward biased relationship with said first power supply terminal;
   a second circuit branch having a second load element and a second diode, a first terminal of the second load element being coupled to a first terminal of the second diode and to the second input terminal of the differential amplifier and a second terminal of the second diode being coupled to a second power supply terminal of the circuitry in a forward biased relationship with said second power supply terminal; and
   the second terminal of the first diode being further coupled to the second terminal of the second load element and the second terminal of the second diode being further coupled to the second terminal of the first load element.

2. The circuitry of claim 1 wherein the first load element comprises a first resistor and the second load element comprises a second resistor and the first and second diodes each comprise a separate field effect transistor with a gate coupled to another terminal thereof.

3. The circuitry of claim 2 wherein the field effect transistors are complentary with the transistor of the first branch circuit being an n-channel field effect transistor with a gate and drain thereof being coupled together and with the transistor of the second branch circuit being a p-channel field effect transistor with the gate and drain thereof being coupled together.

4. The circuitry of claim 1 wherein:
   the first diode comprises a first field effect transistor having a gate, a drain and a source, and the second diode comprises a second field effect transistor having a gate, a drain and a source;
   the gate and drain of each of the first and second transistors being coupled together; and
   the first load element comprises a third field effect transistor having a gate, a drain and a source, and the second load element comprises a fourth field effect transistor having a gate, a drain and a source.

5. The circuitry of claim 4 wherein:
   the first and third transistors are n-channel field effect transistors and the second and fourth transistors are p-channel field effect transistors;
   the source of the first transistor and the drain of the third transistor are coupled to the first input terminal of the differential amplifier;
   the source of the second transistor and the drain of the fourth transistor are coupled to the second input of the differential amplifier;
   the drain and gate of the first transistor are coupled to the source of the fourth transistor and to the first power supply terminal of the circuitry; and
   the source of the third transistor is coupled to the gate and drain of the second transistor and to the second power supply terminal of the circuitry.

6. A circuit for generating a power-on-reset signal at an output thereof comprising:
   an electric power supply having first and second terminals,
   a first field effect transistor having a gate, a drain and a source,
   a first resistive element having first and second terminals,
   one of the source and drain of the first field effect transistor being coupled to the first terminal of the first resistive element,
   the other of the source and drain of the first field effect transistor being coupled to the first terminal of the power supply,
   the gate of the first field effect transistor being coupled to the drain thereof,
   the second terminal of the first resistive element being coupled to the second terminal of the power supply, the first field effect transistor and first resistive element being thus responsive to a first voltage level at the first terminal of the power supply to generate a first signal at the first terminal of the first resistive element which tracks the first voltage level at a predetermined threshold below the first voltage level,
   a second field effect transistor with a gate, a drain and a source,
   a second resistive element having first and second terminals,
   one of the source and drain of the second field effect transistor being coupled to the first terminal of the second resistive element,
   the other of the source and drain of the second field effect transistor being coupled to the second terminal of the power supply,
   the gate of the second field effect transistor being coupled to the drain thereof,
   the second terminal of the second resistive element being coupled to the first terminal of the power supply terminal, the second field effect transistor and second resistive element being thus responsive to the first voltage level at the first terminal of the power supply to generate a second signal at the first terminal of the second resistive element which tracks the first voltage level at a predetermined threshold above the second voltage level, and comparison means coupled to receive the first and second signals for comparing the first and second signals and generating the power-on-reset signal, whereby the power-on-reset signal changes from a first logic level to a second logic level to signal a reset as the magnitudes of the first and second signals cross each other.

7. A power-on-reset signal generating apparatus as claimed in claim 6 wherein the second voltage level of the power supply is ground.

8. A power-on-reset signal generating apparatus as claimed in claim 6 wherein the first and second resistive elements comprise first and second resistors.

9. A circuit for generating a power-on-reset signal at an output thereof comprising:

an electric power supply having first and second terminals, a first n-channel field effect transistor having a gate, a drain and a source, a first resistive element having first and second terminals, the source of the first n-channel field effect transistor being coupled to the first terminal of the first resistive element, the drain of the first n-channel field effect transistor being coupled to the gate thereof and to the first terminal of the power supply, the second terminal of the first resistive element being coupled to the second terminal of the power supply, the first n-channel field effect transistor and first resistive element being thus responsive to a first voltage level at the first terminal of the power supply to generate a first signal at the first terminal of the first resistive element which tracks the first voltage level at a predetermined threshold below the first voltage level, a first p-channel field effect transistor with a gate, a drain and a source, a second resistive element having first and second terminals, the source of the first p-channel field effect transistor being coupled to the first terminal of the second resistive element, the drain of the first p-channel field effect transistor being coupled to the gate thereof and to the second terminal of the power supply, the second terminal of the second resistive element being coupled to the first terminal of the power supply, the first p-channel field effect transistor and second resistive element being thus responsive to the first voltage level at the first terminal of the power supply to generate a second signal at the first terminal of the second resistive element which tracks the first voltage level at a predetermined threshold above the second voltage level, and comparison means coupled to receive the first and second signals for comparing the first and second signals and generating the power-on-reset signal, whereby the power-on-reset signal changes from a first logic level to a second logic level to signal a reset as the magnitudes of the first and second signals cross each other.

10. A power-on-reset signal generating apparatus as claimed in claim 9 wherein the second voltage level of the power supply is ground.

11. A power-on-reset signal generating apparatus as claimed in claim 9 wherein the first resistive element comprises a second n-channel field effect transistor and the second reisistive element comprises a second p-channel field effect transistor, each transistor having a gate, a drain and a source.

12. A power-on-reset signal generating apparatus as claimed in claim 11 wherein the comparison means comprises a differential amplifier having a first input coupled to the first terminal of the first resistive element, having a second input coupled to the first terminal of the second resistive element, and having an output coupled to an output terminal.

13. A power-on-reset signal generating apparatus as claimed in claim 12 wherein the differential amplifier comprises a third and a fourth n-channel field effect transistor, each transistor having a gate, a drain and a source, the gate of the third n-channel transistor being coupled to the first input of the differential amplifier and the gate of the fourth n-channel transistor being coupled to the second input of the differential amplifier;

the comparison means further comprises a fifth n-channel field effect transistor and a third and a fourth p-channel field effect transistor, each transistor having a gate, a drain and a source;

the sources of the third and fourth n-channel transistors being coupled to the drain of the fifth n-channel transistor;

the source of the fifth n-channel transistor being coupled to the second terminal of the power supply;

the drains of the third n-channel and third p-channel transistors being coupled to the output terminal;

the drains of the fourth n-channel and fourth p-channel transistors being coupled to the gates of the third and fourth p-channel transistors; and the sources of the third and fourth p-channel transistors and the gate of the fifth n-channel transistor being coupled to the first terminal of the power supply.

14. A power-on-reset signal generating apparatus as claimed in claim 13 wherein the comparison means further comprises a first and a second inverter, a first and a second capacitor means, and a fifth p-channel field effect transistor having a gate, a source and a drain, each inverter having an input, an output, and a first and a second power supply terminal, each capacitor means having a first and a second terminal;

the first input circuit further comprises a sixth p-channel field effect transistor having a gate, a source and a drain, and a third capacitor means having a first and a second terminal;

the second input circuit further comprises a sixth n-channel field effect transistor having a gate, a source and a drain, and a fourth capacitor means having a first and a second terminal;

the source of the fifth p-channel transistor, the first terminal of the first capacitor means, first power supply terminals of the first and second inverters, the source of the sixth p-channel transistor and the first terminal of the fourth capacitor means being coupled to the first terminal of the power supply;

the first terminal of the second capacitor means, the first terminal of the third capacitor means, the source of the sixth n-channel transistor, the second power supply terminals of the first and second inverters being coupled to the second terminal of the power supply;

the differential amplifier output terminal being coupled to the second terminal of the first capacitor means and to the input of the first inverter;

the output of the first inverter being coupled to the input of the second inverter, to the first terminal of the second capacitor means, and to the gates of the second p-channel and sixth n-channel transistors;

the output of the second inverter being coupled to the gates of the fifth and sixth p-channel and second n-channel transistors;

the drain of the fifth p-channel transistor being coupled to the drains of the fourth p-channel and fourth n-channel transistors and to the gates of the third and fourth p-channel transistors;

the second terminal of the third capacitor means being coupled to the drains of the second n-channel and sixth p-channel transistors, to the source of the first n-channel transistor and to the first input of the differential amplifier;

the second terminal of the fourth capacitor means being coupled to the drains of the second p-channel and sixth n-channel transistors, to the source of the first p-channel transistor and to the second input of the differential amplifier.

15. A power-on-reset signal generating apparatus as claimed in claim 14 further comprising:

a buffer having an input coupled to the output of the second inverter and having an output coupled to a buffer output terminal.

16. A power-on-reset signal generating apparatus as claimed in claim 15 wherein the buffer comprises a third and a fourth inverter, each inverter having an input, an output, and a first and a second power supply terminal;

the first power supply terminals of the third and fourth inverters being connected to the first terminal of the power supply;

the second power supply terminals of the third and fourth inverters being connected to the second terminal of the power supply;

the input of the third inverter being coupled to the output of the second inverter;

the output of the third inverter being coupled to the input of the fourth inverter;

the output of the fourth inverter being coupled to the buffer output terminal.

17. A power-on-reset signal generating apparatus as claimed in claim 16 wherein each of the inverters comprises a p-channel field effect transistor and an n-channel field effect transistor with the gates being coupled together and serving as the input of the inverter, and with the drains being coupled together and serving as the output of the inverter;

the sources of the p-channel transistors of the inverters being coupled to the first power supply terminals of the inverters; and the sources of the n-channel transistors of the inverters being coupled to the second power supply terminals of the inverters.

18. A power-on-reset signal generating apparatus as claimed in claim 17 wherein the first capacitor means comprises a seventh p-channel field effect transistor having a gate, a drain and a source, with the gate being the second terminal of the first capacitor means and with the drain and source coupled together being the first terminal of the first capacitor means;

the second capacitor means comprises a seventh n-channel field effect transistor having a gate, a drain and a source, with the gate being the second terminal of the second capacitor means and with the drain and source coupled together being the first terminal of the second capacitor means;

the third capacitor means comprises an eight n-channel field effect transistor having a gate, a drain and a source, with the gate being the second terminal of the third capacitor means and with the drain and source coupled together being the first terminal of the third capacitor means; and the fourth capacitor means comprises an eighth p-channel field effect transistor having a gate, a drain and a source, with the gate being the second terminal of the fourth capacitor means and with the drain and source coupled together being the first terminal of the fourth capacitor means.

19. A power-on-reset signal generating apparatus as claimed in claim 18 wherein all of the transistors are insulated gate field effect transistors.

* * * * *